United States Patent [19]

Tomizawa et al.

[11] Patent Number: 4,942,420
[45] Date of Patent: Jul. 17, 1990

[54] HEAT/PRESSURE APPLYING UNIT FOR COPYING APPARATUS

[75] Inventors: Takashi Tomizawa, Aichi; Shigeyuki Hayashi, Nagoya; Motoshi Ohno, Nagoya; Takashi Nakata, Nagoya; Yoichi Horaguchi, Nagoya, all of Japan

[73] Assignee: Brother Kogyo Kabushiki Kaisha, Nagoya, Japan

[21] Appl. No.: 300,437

[22] Filed: Jan. 23, 1989

[30] Foreign Application Priority Data

Jan. 22, 1988 [JP] Japan ................................. 63-7367[U]

[51] Int. Cl.[5] ............................................. G03B 27/32
[52] U.S. Cl. ......................................... 355/27; 219/216
[58] Field of Search ..................... 355/27, 28, 32, 282, 355/283, 285, 286; 219/216

[56] References Cited

U.S. PATENT DOCUMENTS 4,684,784 8/1987 Tamary ................................. 219/216
4,801,949 1/1989 Misono et al. .................. 355/100 X Primary Examiner—Michael L. Gellner
Assistant Examiner—Khanh Dang
Attorney, Agent, or Firm—Kane, Dalsimer, Sullivan, Kurucz, Levy, Eisele and Richard

[57] ABSTRACT

In a heat/pressure applying unit, a pair of rollers cooperate with each other to define a nip therebetween. A recording medium is caused to pass through the nip at which at least one of heat and pressure is applied to the recording medium by the pair of rollers. First and second strippers are associated with at least one of the pair of rollers. The first stripper is arranged adjacent the nip for stripping the recording medium from the one roller. The second stripper is arranged at a location spaced from the first stripper along a peripheral surface of the one roller, for forcibly stripping the recording medium from the one roller.

14 Claims, 2 Drawing Sheets

HEAT/PRESSURE APPLYING UNIT FOR COPYING APPARATUS

BACKGROUND OF THE INVENTION

This invention relates to a heat/pressure applying unit incorporated in, for example, a color copying apparatus or the like and, more particularly, to a mechanism for preventing a recording medium from winding around a pair of rollers of the heat/pressure applying unit.

Conventionally, there is known a Xerographic copying apparatus which has a heat-fixing unit composed of a pair of rollers. One of the pair of rollers is formed by a silicone rubber roller. The other roller has a heat pipe and a halogen lamp arranged along an axis of the heat pipe. Toner transferred onto an ordinary sheet of paper is caused to pass through a nip between the heat pipe and the silicone rubber roller so that the toner is melted and fixed onto the ordinary sheet. Since the toner has adhesiveness when melted, the roller in contact with the toner is formed of silicone rubber superior in stripping ability.

In order to prevent the sheet from adhering to the silicone rubber roller, a plurality of stripper claws are arranged in a single row in spaced relation to each other along an axis of the silicone rubber roller. Each stripper claw is formed of heat-resistant resinous material, and has an acute forward end. The forward ends of the respective stripper claws get into between the silicone rubber roller and the sheet tending to adhere to the silicone rubber roller, to strip the sheet forcibly from the silicone rubber roller.

In case of the use of a recording medium higher in adhesiveness than the ordinary sheet of paper, such as, for example, a developer sheet having its one side coated with a developer agent, however, the following problem arises. That is, when the developer sheet having carried thereon an image is caused to pass through the nip between the heat pipe and the silicone rubber roller of the heat-fixing unit to promote color development of the developer sheet, the developer sheet frequently winds around the silicone rubber roller, because the adhesiveness of the developer agent melted is stronger in adhesion force than the toner.

Furthermore, the developer agent side of the developer sheet is extremely liable to be marred as compared with the ordinary sheet having carried thereon the toner. In addition, the higher the environmental humidity, the stronger the developer sheet tends to wind around the silicone rubber roller. If the developer sheet winds around the silicone rubber robber, the sheet is brought to high temperature. Thus, there are fears that the developer sheet is burnt and component parts of the heat-fixing unit are damaged.

SUMMARY OF THE INVENTION

It is therefore an object of this invention to provide an improved heat/pressure applying unit capable of ensuring that a recording medium tending to wind around a roller can be stripped from the roller, and also capable of minimizing marring of the recording medium.

For the above purpose, according to the invention, there is provided a heat/pressure applying unit comprising:

a pair of rollers cooperating with each other to define a nip therebetween, wherein a recording medium is caused to pass through the nip at which at least one of heat and pressure is applied to the recording medium by the pair of rollers;

first and second stripper means associated with at least one of the pair of rollers, wherein the first stripper means is arranged adjacent the nip for stripping the recording medium from the one roller, and wherein the second stripper means is arranged at a location spaced from the first stripper means along a peripheral surface of the one roller, for forcibly stripping the recording medium from the one roller.

With the arrangement of the invention, the first stripper means is in contact with the recording medium under usual or ordinary conditions, to strip the same from the one roller. On the other hand, for example, under high temperature and high humidity conditions, the adhesiveness of the recording medium is high so that the recording medium tends to adhere strongly to the one roller. Under the conditions, it is insufficient for the first stripper means to strip the recording medium from the one roller, so that the recording medium tends to wind around the one roller. The second stripper means can forcibly strip the recording medium from the one roller.

Thus, according to the heat/pressure applying unit, it is possible to ensure that the recording medium is stripped from the one roller without winding around the one roller. Moreover, marring of the recording medium can be minimized.

BRIEF DESCRIPTION OF THE ACCOMPANYING DRAWINGS

DESCRIPTION OF THE EMBODIMENT

Figure 1:
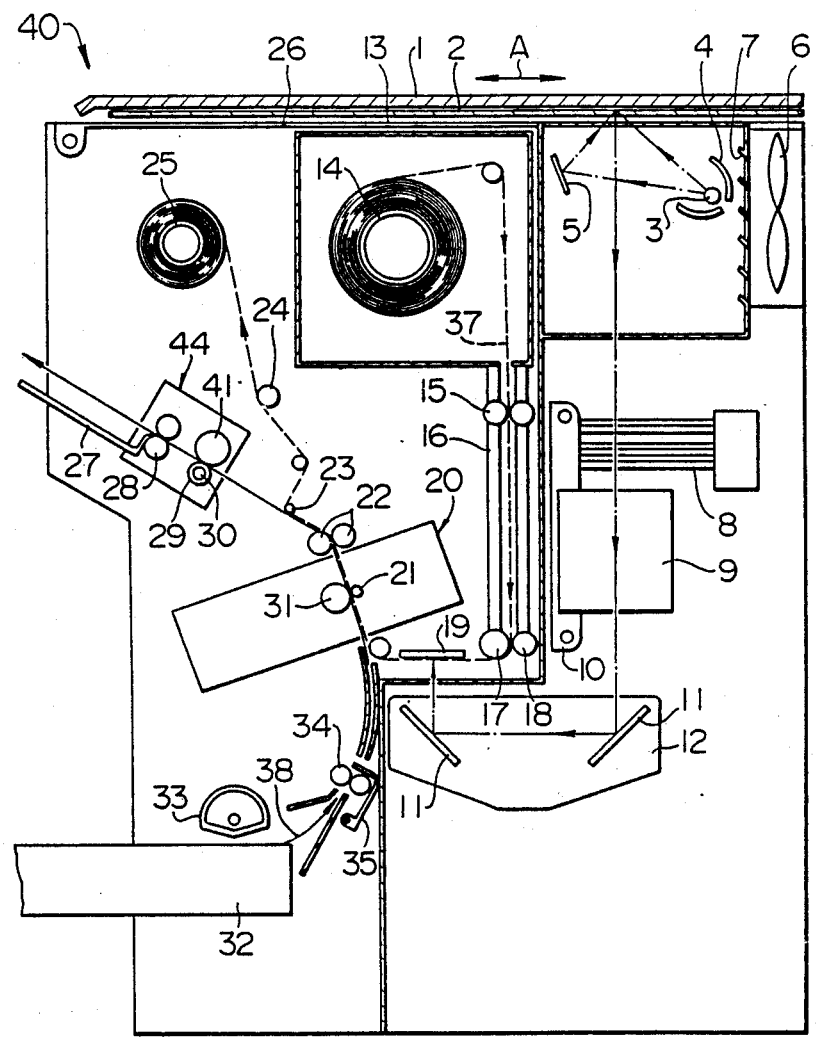
FIG. 1 is a schematic cross-sectional view of a copying apparatus having incorporated therein a heat-fixing unit embodying the invention.

Referring to FIG. 1, there is schematically shown in cross-section a photo and pressure sensitive copying apparatus capable of full color copying. A recording medium enabling such copying is composed of a continuous photo and pressure sensitive recording web and a developer sheet. The continuous web has its one side coated with microcapsules each containing dye precursor, while the developer sheet has its one side coated with developer agent. Such recording medium has been proposed in Japanese Patent Application Laid-Open No. 58-88739 and so on, and is not described here in detail.

As shown in FIG. 1, the copying apparatus, generally desigated by the reference numeral 40, comprises a body 50. An original platen 2 formed of transparent glass is mounted to the top of the body 50 and can be covered with a platen cover 1. Any desirable original is set between the original platen 2 and the platen cover 1 in such a manner that a side of the original having carried thereon color image information faces downwardly. At exposure subsequently to be described, the original platen 2 as well as the platen cover 1 is reciprocatively moved together with the original in a direction indicated by an arrow A.

An exposure system includes a light source 3 such as, for example, a halogen lamp which is fixedly arranged at a right upper location within the body 50. The light source 3 extends horizontally and perpendicularly to the direction A. A reflecting mirror 4 having a generally parabolic cross-sectional shape is so arranged as to surround the light source 3. The light source 3 cooperates with the reflecting mirror 4 to emit light in the form of a line extending horizontally and perpendicularly to the direction A, toward the original platen 2. That is, the light source 3 shines upon a predetermined line on the information side of the original, which extends perpendicularly to the arrowed direction A.

When the original platen 2 as well as the platen cover 1 slides in the direction A, the light from the light source 3 shines successively upon consecutive surface sections of the original platen 2 so that the entire surface of the platen 2 from the left-hand end to the right-hand end thereof as viewed in FIG. 1 can be illuminated with the light. The light emitted from the light source 3 is transmitted through the transparent original platen 2 and is reflected by the original placed on the platen 2. The platen cover 1 is provided which covers an upper surface of the original platen 2 to prevent the emitted light from leaking through areas of the original platen 2 except for an area thereof on which the original is placed.

A reflector 5 is arranged on the left of the light source 3 in order that the light emitted from the light source 3 is utilized at high efficiency for shining upon the original. That is, the reflector 5 reflects a part of the light which is not directly directed toward the original, to utilize the reflected light part to again shine upon the original.

Arranged on the right of the light source 3 are a fan 6 and a plurality of louvers 7 for directing air from the outside toward the original platen 2 so that the original platen 2 is exposed to the air efficiently.

The light emitted from the light source 3 and reflected from the original on the original platen 2 advances along a predetermined optical path and is caused to pass through a filter 8 which is provided for altering the transmission characteristic of the light in accordance with the sensitivity characteristic of a continuous photo and pressure sensitive recording web 37, thereby adjusting the tone of color of a copied image. The light is then caused to pass through a lens assembly 9 which is mounted to a lens attaching plate 10 such that the lens assembly 9 is capable of being adjusted in angle finely or minutely with respect to the predetermined optical path.

The light condensed by the lens assembly 9 is changed in direction by 180° by a pair of reflecting mirrors 11 and 11, and is focused onto a portion of the continuous web 37 which is in close contact with a lower surface of an exposure platen 19. The pair of reflecting mirrors 11 and 11 are mounted to a mirror mounting plate 12 in such a manner that the attaching position of the mirror mounting plate 12 can minutely be regulated to adjust the length of the optical path and to adjust the focus of the lens assembly 9.

The continuous web 37 is wound about a cartridge shaft 14 into a roll which is accommodated in a removable or detachable cartridge 13 arranged below the original platen 2. One end portion of the web 37 passes by a plurality of rollers and extends through a pressure developing unit 20. The one end portion of the web 37 finally reaches a take-up shaft 25.

Specifically, the web 37 coming out of the cartridge 13 through a bottom wall thereof is guided by a pair of feed rollers 15 and a pair of guide rollers 17 and 18, and passes below the exposure platen 19. Subsequently, the web 37 is delivered into the pressure developing unit 20. The web 37 having passed through the pressure developing unit 20 is fed by a pair of feed rollers 22, and is guided by a separator roller 23 and a meandering regulator roller 24. The web 37 is then taken up about the take-up shaft 25. An unexposed portion of the web 37 just after coming out of the cartridge 13 is maintained unexposed by a light-shielding cover 16.

The transport speed of the web 37 is controlled constant by the feed rollers 22, and is brought into coincidence with the moving speed of the original platen 2. Thus, latent image portions corresponding respectively to the consecutive sections of the original, which pass successively across the aforesaid predetermined line, are formed successively onto consecutive sections of the web 37 passing across the exposure platen 19. In this manner, a latent image corresponding to the color image information on the original is formed onto a portion of the web 37.

Arranged below the pressure developing unit 20 is a sheet cassette 32 accommodating therein a stack of developer sheets 38 of cut sheet type. Above the sheet cassette 32, a semi-circular roller 33 is arranged for drawing the developer sheets 38 one by one out of the sheet cassette 32. The leading edge of the drawn developer sheet 38 is positioned and aligned under the action of a pair of rollers 34 and a register gate 35. Subsequently, the drawn developer sheet 38 is transported toward an inlet of the pressure developing unit 20.

The developer sheet 38 is brought into close contact with the portion of the web 37 having carried thereon the latent image. That is, the developer sheet 38 and the portion of the web 37 are superimposed one upon the other and are transported toward the inlet of the pressure developing unit 20. The pressure developing unit 20 comprises a small-diameter roller 21 and a backup roller 31. The web and developer sheet 37 and 38 superimposed one upon the other such that the side of the web 37 having carried thereon the latent image is in close contact with the developer agent side of the developer sheet 38, are caused to pass through a nip between the small-diameter roller 21 and the backup roller 31 and are pressurized thereby. By the pressure, unexposed microcapsules on the portion of the web 37 are ruptured so that the latent image on the portion of the web 37 is developed onto the developer sheet 38. Thus, an image, which corresponds to the latent image, is formed on the developer sheet 38.

The superimposed web and developer sheet 37 and 38 coming out of the pressure developing unit 20 are transported by the feed rollers 22, and are separated from each other by a separator roller 23. The separated web 37 is transported upwardly and passes by the meandering regulator roller 24, so that the used portion of the web 37 is wound around the take-up shaft 25. On the other hand, the separated developer sheet 38 advances straight toward a heat-fixing unit 44 where the color development of the developer sheet 38 is promoted so that the image is recorded onto the developer sheet 38. Subsequently, the developer sheet 38 is discharged out of the body 50 onto a discharge tray 27 with the image side of the developer sheet 38 facing upwardly. The heat-fixing unit 44 comprises a hollow heat roller 29 having incorporated therein a heater 30, and a pair of feed rollers 28.

The operation of the copying apparatus constructed above will be described below.

The platen cover 1 is moved angularly to an open position, and the original is placed on the original platen 2. The platen cover 1 is then returned to its closed position illustrated in FIG. 1. Subsequently, a start-up button (not shown) is depressed. The original platen 2 is first moved to the right as viewed in FIG. 1 and is stopped at a position where the left-hand end of the original platen 2 faces toward the light source 3. The original platen 2 is then moved to the left with the light source 3 turned on. The light emitted from the light source 3 is reflected by the original, and passes through the filter 8 and the lens assembly 9. The light is then reflected by the pair of reflecting mirrors 11 and 11, and is focused onto a portion of the web 37 on the exposure platen 19. The web 37 is transported at the same speed as the moving speed of the original platen 2, that is, in synchronism with the movement of the original platen 2. Thus, a latent image corresponding to the image information on the original is formed onto the portion of the web 38.

In synchronism with the movement of the original plate 2 to the left, the uppermost developer sheet 38 is drawn out of the cartridge 32 by the semi-circular roller 33. The drawn developer sheet 38 is superimposed upon the portion of the web 37 having carried thereon the latent image. The superimposed web and developer sheet 37 and 38 are transported into the pressure developing unit 20 where the latent image on the portion of the web 37 is developed onto the developer sheet 38 so that an image corresponding to the latent image is formed on the developer sheet 38.

Subsequently, the image on the developer sheet 38 is heat-fixed by the heat-fixing unit 44. That is, the developer sheet 38 having passed through the pressure developing unit 20 and having separated from the web 37 by the separator roller 23 is delivered into the heat-fixing unit 44. Heat energy is given to the developer sheet 38 having carried thereon the image, by the heat-fixing unit 44 so that the color development is promoted and a gloss is given to the image side of the developer sheet 38. The developer sheet 38 is then discharged out of the body 50. On the other hand, the used portion of the web 37 having passed through the pressure developing unit 20 and separated from the developer sheet 38 by the separator roller 23 is successively taken up by the take-up shaft 25. When the original platen 2 is moved to a position where the right-hand end of the original platen 2 faces toward the light source 3, copying of the original is completed, and the light source 3 is turned off.

The heat-fixing unit 44 will next be described in detail.

Figure 2:
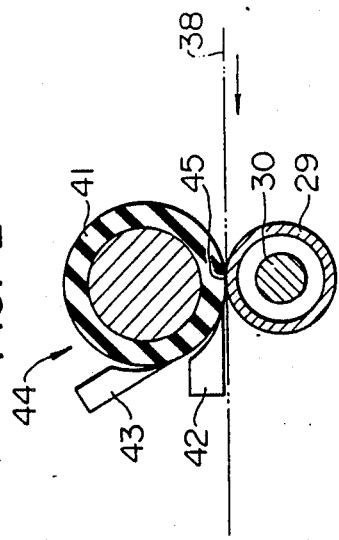
FIG. 2 is a cross-sectional view of the heat-fixing unit illustrated in FIG. 1.
Figure 3:
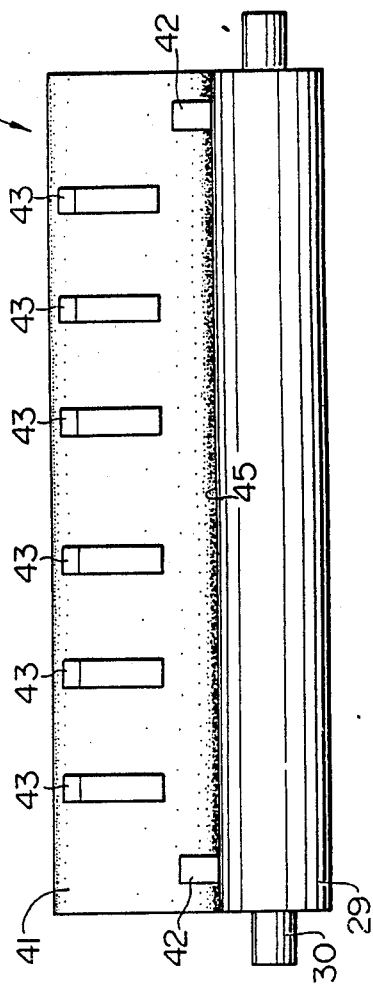
FIG. 3 is a left-hand side elevational view of the fixing unit illustrated in FIG. 2.

As shown in FIGS. 2 and 3, the heat-fixing unit 44 comprises the aforesaid hollow heat roller 29 which is arranged rotatable in concentric relation to the heater 30 serving as a stationary heat source. The heater 30 may be a halogen lamp, a sheath heater or the like. A silicone rubber roller 41 is so arranged as to have its axis extending in parallel relation to an axis of the heat roller 29 in a common plane such that the silicone rubber roller 41 and the heat roller 29 cooperate with each other to define a nip 45 therebetween. The silicone rubber roller 41 is pressed against the heat roller 29 at the nip 45 with a predetermined pressure.

A pair of first stripper pawls 42 and 42 are arranged adjacent the nip 45. Specifically, the first stripper pawls 42 and 42 are arranged respectively at opposite ends of the nip 45 such that the pawls 42 and 42 can engage respectively with the opposite side edges of the developer sheet 38, for stripping the developer sheet 38 from the silicone rubber roller 41.

A plurality of second stripper pawls 43 are arranged adjacent a peripheral surface of the silicone rubber roller 41 and above the first stripper pawls 42 which are arranged adjacent the nip 45. That is, the plurality of second stripper pawls 42 are arranged between the pair of first stripper pawls 42 and 42 and in spaced relation to each other along the axis of the silicone rubber roller 41. Thus, the second stripper pawls 42 are so designed as to engage with a widthwise central region of the developer sheet 38, for forcibly stripping the developer sheet 38 from the silicone rubber roller 41.

The developer sheet 38 enters the nip 45 between the heat roller 29 and the silicone rubber roller 41, from the right as viewed in FIG. 2. At this time, the side of the developer sheet 38 having carried thereon the image faces toward the silicone rubber roller 41. This is because the heat roller 29 is higher in temperature than the silicone rubber roller 41 so that if the image side of the developer sheet 38 faces toward the heat roller 29, the developer sheet 38 violently adheres to the heat roller 29.

The developer agent on the image side of the developer sheet 38 is melted by heat from the heat roller 29 so that the developer agent tends to adhere to the peripheral surface of the silicone rubber roller 41. Under the ordinary temperature and humidity conditions, however, the developer sheet 38 having passed through the nip 45 between the heat roller 29 and the silicone rubber roller 41 is stripped by the pair of first stripper pawls 42 and 42, and is discharged to the left as viewed in FIG. 2.

Under the high temperature and high humidity conditions, adhesion force of the developer sheet 38 to the silicone rubber roller 41 is strong so that there may be a case where it is insufficient for the pair of first stripper pawls 42 and 42 to completely strip the developer sheet 38 from the silicone rubber roller 41, because the pair of first stripper pawls 42 and 42 engage respectively with only the opposite side edges of the developer sheet 38. In this case, should the pair of first stripper pawls 42 and 42 be arranged at the central region of the nip 45, it would be made easy to strip the developer sheet 38 from the silicone rubber roller 41. However, this is not preferable under the ordinary temperature and humidity conditions, because the pair of first stripper pawls 42 and 42 arranged at the central region of the nip 45 may mar the image at the central region of the developer sheet 38.

The developer sheet 38, which has failed to be stripped from the silicone rubber roller 41 by the pair of first stripper pawls 42 and 42, is forcibly stripped from the silicone rubber roller 41 by the plurality of second stripper pawls 43 even if the image on the developer sheet 38 is marred, in order to prevent burning of the developer sheet 38 and damages on the component parts of the heat-fixing unit 44.

Thus, according to the copying apparatus embodying the invention, the developer sheet 38 can be stripped from the silicone rubber roller 41 with minimum marring of the image on the developer sheet 38 under the ordinary temperature and humidity conditions, in spite of the fact that the developer sheet 38 is liable to be marred and is strong in adhesion force as compared with the ordinary sheet of paper having carried thereon a toner image. On the other hand, even under the high temperature and high humidity conditions, the developer sheet 38 can effectively be prevented from winding around the silicone rubber roller 41, making it possible to eliminate damages on the component parts of the heat-fixing unit 44.

It is to be understood that the invention is not limited to the above-described specific embodiment, but various changes and modifications can be made to the invention. For instance, two sets of first and second stripper pawls 41 and 42 may be associated respectively with the pair of rollers 41 and 29. Moreover, it is needless to say that any desirable recording media other than the one composed of the continuous web and the developer sheet can be employed.

What is claimed is:

1. A heat/pressure applying unit comprising:
   a pair of rollers cooperating with each other to define a nip therebetween, wherein a recording medium is caused to pass through said nip at which at least one of heat and pressure is applied to the recording medium by said pair of rollers;
   first and second stripper means associated with at least one of said pair of rollers, wherein said first stripper means is arranged adjacent said nip for stripping said recording medium from said at least one roller of said pair of rollers, and wherein said second stripper means is arranged at a location spaced downstream from said first stripper means in the direction of rotation of said at least one roller along a peripheral surface of said at least one roller, for forcibly stripping said recording medium from said at least one roller.

2. The heat/pressure applying unit according to claim 1, wherein said first stripper means includes a pair of stripper pawls arranged respectively at opposite ends of said nip, while said second stripper means is arranged between said pair of stripper pawls.

3. The heat/pressure applying unit according to claim 2, wherein said second stripper means includes a plurality of stripper pawls arranged in spaced relation to each other along an axis of said one roller.

4. The heat/pressure applying unit according to claim 1, wherein said pair of rollers have their respective axes extending in parallel relation to each other in a common plane.

5. The heat/pressure applying unit according to claim 1, wherein said one roller is a silicone rubber roller, while the other roller has incorporated therein heating means for heating the other roller.

6. The heat/pressure applying unit according to claim 5, wherein the other roller is a hollow heat roller arranged in concentric relation to said heating means.

7. A copying apparatus for use with a photo and pressure sensitive recording medium and a developer sheet, which comprises:
   original support means for supporting an original having carried thereon image information;
   an optical system including a light source means for emitting light to shine upon the original, and optical means for directing the light reflected from the original, toward said recording medium to expose the same to the light thereby forming a latent image onto said recording medium, the latent image corresponding to said image information on the original;
   means for developing said latent image on said recording medium, onto said developer sheet to form an image corresponding to said latent image, onto said developer sheet; and
   fixing means for fixing said image on said developer sheet, said fixing means comprising a pair or rollers cooperating with each other to define a nip therebetween, said developer sheet being caused to pass through said nip at which at least one of heat and pressure is applied to said developer sheet by said pair or rollers, and first and second stripper means associated with at least one of said pair of rollers, said first stripper means being arranged adjacent said nip for stripping said developer sheet from said at least one roller of said pair of rollers, while said second stripper means is arranged at a location spaced downstream from said first stripper means in the direction of rotation of said at least one roller along a peripheral surface of said at least one roller, for forcibly stripping said developer sheet from said at least one roller.

8. The copying apparatus according to claim 7, wherein said first stripper means includes a pair of stripper pawls arranged respectively at opposite ends of said nip, while said second stripper means is arranged between said pair of stripper pawls.

9. The copying apparatus according to claim 8, wherein said second stripper means includes a plurality of stripper pawls arranged in spaced relation to each other along an axis of said one roller.

10. The copying apparatus according to claim 7, wherein said pair of rollers have their respective axes extending in parallel relation to each other in a common plane.

11. The copying apparatus according to claim 7, wherein said one roller is a silicone rubber roller, while the other roller has incorporated therein heating means for heating the other roller.

12. The copying apparatus according to claim 11, wherein the other roller is a hollow heat roller arranged in concentric relation to said heating means.

13. The copying apparatus according to claim 7, wherein said developer sheet has its one side coated with a developer agent, said developer sheet being caused to pass through said nip with said one side facing toward said one roller.

14. The copying apparatus according to claim 13, wherein said recording medium is in the form of a continuous web having its one side coated with microcapsules each containing dye precursor.

* * * * *